(12) United States Patent
Song

(10) Patent No.: US 7,779,325 B2
(45) Date of Patent: Aug. 17, 2010

(54) DATA DETECTION AND DECODING SYSTEM AND METHOD

(75) Inventor: Hongwei Song, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 1143 days.

(21) Appl. No.: 11/041,694

(22) Filed: Jan. 24, 2005

(65) Prior Publication Data

US 2006/0168493 A1    Jul. 27, 2006

(51) Int. Cl.
*H03M 13/00*    (2006.01)
(52) U.S. Cl. .................. 714/752; 714/795; 714/780
(58) Field of Classification Search ............. 714/752, 714/795, 780
See application file for complete search history.

(56) References Cited

U.S. PATENT DOCUMENTS

| | | | | |
|---|---|---|---|---|
| 6,704,376 B2* | 3/2004 | Mills et al. | ............... | 375/341 |
| 2005/0273688 A1* | 12/2005 | Argon | ............... | 714/755 |
| 2006/0140311 A1* | 6/2006 | Ashley et al. | ............... | 375/341 |
| 2007/0192666 A1* | 8/2007 | Song et al. | ............... | 714/780 |

* cited by examiner

*Primary Examiner*—Scott T Baderman
*Assistant Examiner*—Enam Ahmed

(57) ABSTRACT

A data detection and decoding system includes a SOVA channel detector that uses single parity (SOVASP) to improve the accuracy with which the detector estimates bits. Each column or row read back from the read channel constitutes a code word and each code word is encoded to satisfy single parity. Because the SOVASP channel detector detects whether each code word satisfies single parity, it is unnecessary to use both a column decoder and a row decoder in the channel decoder. Either the row decoder or the column decoder can be eliminated depending on whether bits are read back on a column-by-column basis or on a row-by-row basis. This reduction in components reduces hardware complexity and improves system performance. The output of the row or column decoder is received by a second detector that processes the output received from the decoder to recover the original information bits.

18 Claims, 8 Drawing Sheets

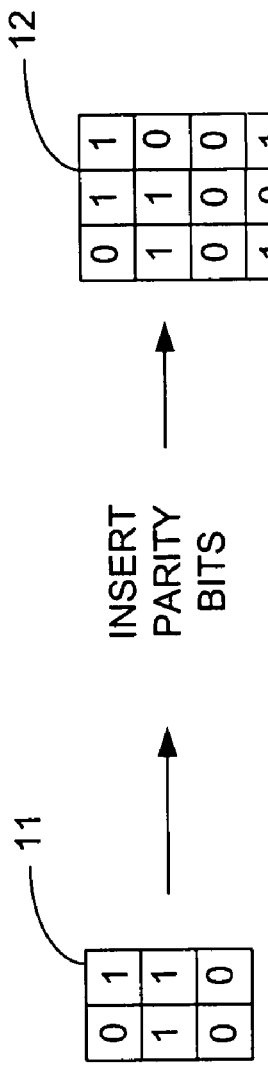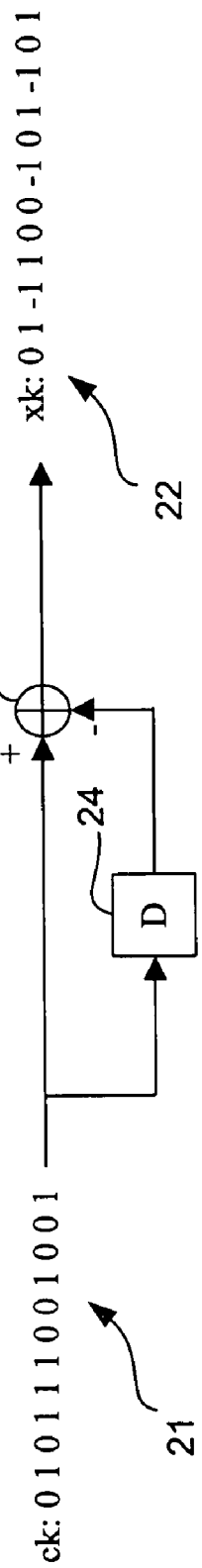

DATA DETECTION AND DECODING SYSTEM AND METHOD

TECHNICAL FIELD OF THE INVENTION

The invention relates to detecting and decoding digital information. More particularly, the invention relates to a system that includes a channel detector that uses the parity bits used to encode the data to detect data with greater accuracy. The use of the parity bits in the channel detector enables the architecture of the decoder to be greatly simplified while also providing the system with improved performance compared to known data detection and decoding systems.

BACKGROUND OF THE INVENTION

Digital communications systems and digital storage systems (e.g., hard disk drives) are similar from the perspective of extracting the original (transmitted or stored) bits from the received signal or from the readback signal. In the case of communications channels, the digital information is transferred from one location to another location, but at the same time (perhaps with a small transmission delay), whereas in storage channels, the information is transferred from one time to a later time, but at the same location. The goal in both cases is to retrieve the original bits as accurately as possible in the presence of impairments such as noise and inter-symbol interference (ISI).

One method for improving the accuracy of the retrieved digital information involves using error correcting codes (ECCs). ECCs typically use parity bits to introduce redundancy into the signal prior to transmission or storage. Such redundancy is subsequently used to decode the encoded information. In order to demonstrate the typical manner in which parity bits are currently used for this purpose, an example of a known digital storage system and its operations will be described with reference to FIGS. 1-5.

FIG. 1 illustrates a block diagram of a known digital storage system 1 that uses parity bits to encode information prior to storing the information. The digital storage system 1 includes an encoder 2 that encodes information bits by pseudo-randomly interleaving parity bits throughout the information bits. The encoder 2 is typically a two-dimensional product code (TPC) encoder. The encoded information bits are subsequently read out of the recording channel 3. The recording channel 3 typically includes physical and electrical components (not shown), such as the read/write head, the read/write head armature, the recording media, the pre-amplifier, etc.

As encoded information bits are read out of the recording channel 3, they are processed by a channel detector 4 that performs an algorithm to detect bits. The detector 4 is typically a hard Viterbi detector that produces hard decisions (i.e., a decision that a bit is either a 1 or a 0) or a soft-output Viterbi algorithm (SOVA) detector that produces hard decisions and reliability estimates (i.e., respective estimates as to the reliability of the respective hard decisions). The soft and hard outputs of the channel detector 4 are received by a channel decoder 5, which deinterleaves the parity bits and decodes the bit sequence using the soft and hard outputs from the SOVA channel detector 4.

For this example, it will be assumed that a particular sequence of original information bits, uk=010110, is to be stored in the recording channel 3. This particular sequence is represented by the 3×2 table 11 shown in FIG. 2A. The sequence is encoded by the encoder 2 to produce a codeword. Assuming that the encoder 2 is a two-dimensional product (TPC) encoder, a parity bit is added to each row and to each column of the 3×2 table 11 to produce an even parity code (i.e., each column and each row contains an even number of 1's). The resulting 4×3 table 12 is shown in FIG. 2B. For this example, it will be assumed that each column in the 4×3 table 12 corresponds to a single parity codeword. However, this is not normally the case. As stated above, the parity bits are typically pseudo-randomly interleaved throughout the original information bits. For ease of explanation, the parity bits are shown as simply added to each row and column of table 11 in such a way that each 4-bit column of table 12 is provided with even parity.

The resulting codeword ck=010111001001 is recorded in the recording channel 3. The signal xk read from the recording channel 3 is typically corrupted by noise, nk, such as additive Gaussian noise, for example, which produces samples yk that are received by the channel detector 4. The channel detector 4, which will be assumed to be a SOVA detector for this example, receives the samples yk and produces hard decisions and corresponding soft reliability estimates. This information is then processed by the decoder 5 to produce the recovered information bits.

The recording channel 3 may be modeled as a very simple partial response one-delay (1-D) element channel, as shown in FIG. 3. The recording channel 3 modeled as a 1-D element channel 20 has an input 21, an output 22, a summer 23 and a delay element 24. The summer 23 sums the bit stored in the delay element 24 with the current bit in the ck sequence to produce a current bit in the output sequence xk.

FIG. 4 illustrates a state trellis diagram 30 for the 1-D element channel 20 shown in FIG. 3. The channel model 20 has two states, namely, state 0 and state 1. The channel states depend on the bit stored in the delay element 24. The initial state of the delay element 24 is presumed to be zero. Each of the transition branches 32-35 in the trellis diagram 30 is associated with one input bit and one output bit. For example, "0/1" corresponds to an input bit 1 and an output bit 0. If the state of the delay element 24 is 0 at time k−1 and the channel input bit is 0 at time k−1, then the channel output bit at time k−1 is 0 (i.e., 0+0). Branch 32 of the trellis diagram 30 represents this 0/0 output/input. If the channel input bit at time k−1 is 1 and the state of the delay element 24 is 0 at time k−1 then the channel output bit at time k−1 is 1 (i.e., 1-0). Branch 33 of the trellis diagram 30 represents this 1/1 output/input. If the state of delay element 24 at time k−1 is 1 and the channel input at time k−1 is 0, then the channel output at time k−1 is 0. Branch 34 of the trellis diagram 30 represents this−1/0 output/input. If the state of delay element 24 at time k−1 is 1 and the channel input at time k−1 is 1, then the channel output at time k−1 is 0. Branch 35 of the trellis diagram 30 represents this 0/1 output/input.

FIG. 5 illustrates the 1-D trellis diagram 40 corresponding to the ideal channel output, xk=01-1100-101-101, for the channel input, ck=010111001001, for times k=0 through k=11 for the entire 12-bit sequence shown in FIG. 3. The sequences ck, xk, nk, and yk for this example are listed below in Table 1.

TABLE 1

| | Sequence values | | | | | | | | | | | |
|---|---|---|---|---|---|---|---|---|---|---|---|---|
| k  | 0 | 1  | 2  | 3    | 4 | 5 | 6  | 7   | 8 | 9  | 10 | 11  |
| ck | 0 | 1  | 0  | 1    | 1 | 1 | 0  | 0   | 1 | 0  | 0  | 1   |
| xk | 0 | 1  | −1 | 1    | 0 | 0 | −1 | 0   | 1 | −1 | 0  | 1   |
| nk | 0 | 0  | 0  | −0.6 | 0 | 0 | 0  | 0.5 | 0 | 0  | 0  | 0.2 |
| yk | 0 | 1  | −1 | 0.4  | 0 | 0 | −1 | 0.5 | 1 | −1 | 0  | 1.2 |

The SOVA detector 4 determines the maximum likelihood (ML) path that has the minimum distance to the received sequence yk. Assuming the initial state of the delay element is 0, the ML path is made up of branches 41-52 of the trellis 40 shown in FIG. 5. As is well know in the art, the ML path is chosen by selecting the branches that have ideal inputs that are closest to the values of the corresponding yk samples. For example, for yk=0 at time k=0, the chosen branch is the 0/0 branch labeled 41. For yk=1 at time k=1, the chosen branch is the 1/1 branch labeled 42. For yk=−1 at time k=2, the chosen branch is the −1/0 branch labeled 43.

By continuing to perform this algorithm for times k=3 through k=11, the SOVA detector 4 generates an estimated input bit sequence of 010000001001 for times k=1 through k=11. A comparison of this sequence with the original input sequence ck shown in Table 1 shows that the bit decisions made by the SOVA detector 4 for times k=3, k=4 and k=5 do not have the same values as the bits of the ck sequence for those same times. Therefore, although the SOVA detector 4 is reasonably accurate at detecting bits, there is room for improvement.

As stated above with reference to FIG. 1, the decoder 5 receives the hard and soft outputs from the SOVA channel detector 4 and uses this information to decode the bit sequence read from the read channel and recover the original information bits. One known way to improve the accuracy with which bits are detected and decoded is to implement channel detector and decoder hardware that provides for iteration of the data detection and decoding processes. However, this typically involves duplicating detection and decoding logic and memory, which is expensive in terms of hardware and in terms of the amount of area that the hardware consumes on the integrated circuit (IC) in which these components are incorporated.

FIG. 6 illustrates a block diagram of typical detector and decoder hardware 60 configured to provide iteration of the data detection and decoding processes described above with reference to FIGS. 1-5. A first SOVA channel detector 61 processes the bit sequences read from the read channel in the manner described above and generates hard and soft outputs. A first channel decoder, which is represented by the components within the dashed box 62, receives the hard and soft outputs generated by the detector 61. The first channel decoder 62 includes first and second row decoders 63 and 66, respectively, first and second column decoders 64 and 67, respectively, a delay element 65 and summers 68, 69 and 71.

The encoded bits are typically stored in the read channel in a table comprising rows and columns (e.g., table 12 shown in FIG. 2B). The first row decoder 63 receives the hard and soft detector outputs and uses them to decode the rows. The first column decoder 64 receives the hard and soft detector outputs and uses them to decode the columns. The decoders 63 and 64 generate outputs that are combined by summers 68 and 69 with the delayed outputs of the SOVA detector 61, as delayed by the delay element 65. The combination of the outputs of the SOVA detector 61 and the column decoder 64 are then provided to the second row decoder 66. Likewise, the combination of the outputs of the SOVA detector 61 and the first row decoder 63 are provided to the second column decoder 67. The second row and column decoders 66 and 67, respectively, then use this information to decode the rows and columns.

Thus, the second row decoder 66 uses information generated by the first column decoder 64 to further decode the rows and the second column decoder 67 uses information generated by the first row decoder 63 to further decode the rows. This type of iteration in the decoder requires both column and row decoders because each uses information from the other to make decoding decisions.

In addition, there is also iteration between the detector and decoder processes. As shown in FIG. 6, the outputs of the second row and column decoders 66 and 67 are combined by summer 71 and provided to a second SOVA channel detector 72 and to a delay element 73. The second SOVA detector 72 also receives the same input to the first SOVA detector 61 delayed by delay element 75. The second SOVA detector 72 generates soft and hard outputs that are combined by summer 74 with the delayed combined outputs of the row and column decoders 66 and 67, respectively, as delayed by delay element 73. This information is then provided to a second channel decoder, which is represented by dashed box 76.

The second channel decoder 76 processes the information received by it in the same manner in which the first channel decoder 62 processes information. The second channel decoder 76 includes components 83, 84, 85, 86, 87, 88, 89 and 91 that are identical to components 63, 64, 65, 66, 67, 68, 69 and 71, respectively. In addition, the second channel decoder 76 includes a delay element 92 that provides a time delay that is equal to the time delay provided by delay element 85. The outputs of the row and column decoders 86 and 87 of the second channel decoder 76 are combined by summer 91 with the delayed input to the second channel decoder 76. The result is the recovered original information bits.

While iteration of the type performed by the hardware configuration 60 shown in FIG. 6 improves data detection and decoding accuracy, it requires a large amount of processing logic and memory. Consequently, the iterative hardware configuration 60 consumes a relatively large amount of area on the IC in which the hardware configuration 60 is implemented. The hardware configuration 60 is also relatively inefficient in terms of power consumption. In addition, all of the iterative processing takes a relatively large amount of time to be performed, which decreases the overall speed of the system.

A need exists for a system for detecting and decoding data that has reduced hardware complexity and thus is more efficient in terms of the amount of area required for implementation and in terms of the amount of power it consumes. A need also exists for a system for detecting and decoding data that has reduced hardware complexity and improved performance relative to known systems for detecting and decoding data.

SUMMARY OF THE INVENTION

The invention provides a system for detecting and decoding data and a method for detecting and decoding data. The system comprises a first detector that receives a bit sequence and processes the bit sequence to generate a first hard output and a first soft output, a row or column decoder that receives the first hard and soft outputs generated by the channel detector and generates a second hard output, and a second detector that receives the second hard output generated by the decoder and processes the second hard output to generate at least a third hard output.

The method of the invention comprises receiving and processing a bit sequence in a first data detector to generate a first hard output and a first soft output, processing the first hard and first soft outputs in a decoder to generate a second hard output, and processing the second hard output in a second detector to generate at least a third hard output.

These and other features of the invention will become apparent from the following description, drawings and claims.

BRIEF DESCRIPTION OF THE DRAWINGS

FIG. 2A illustrates a 3×2 table containing original information bits before parity bits have been inserted.

FIG. 2B illustrates a 4×3 table containing original information bits and parity bits.

FIG. 3 illustrates a block diagram of a model of a one-delay (1-D) element recording channel used to model the recording channel shown in FIG. 1.

DETAILED DESCRIPTION OF THE PREFERRED EMBODIMENT

Figure 6:
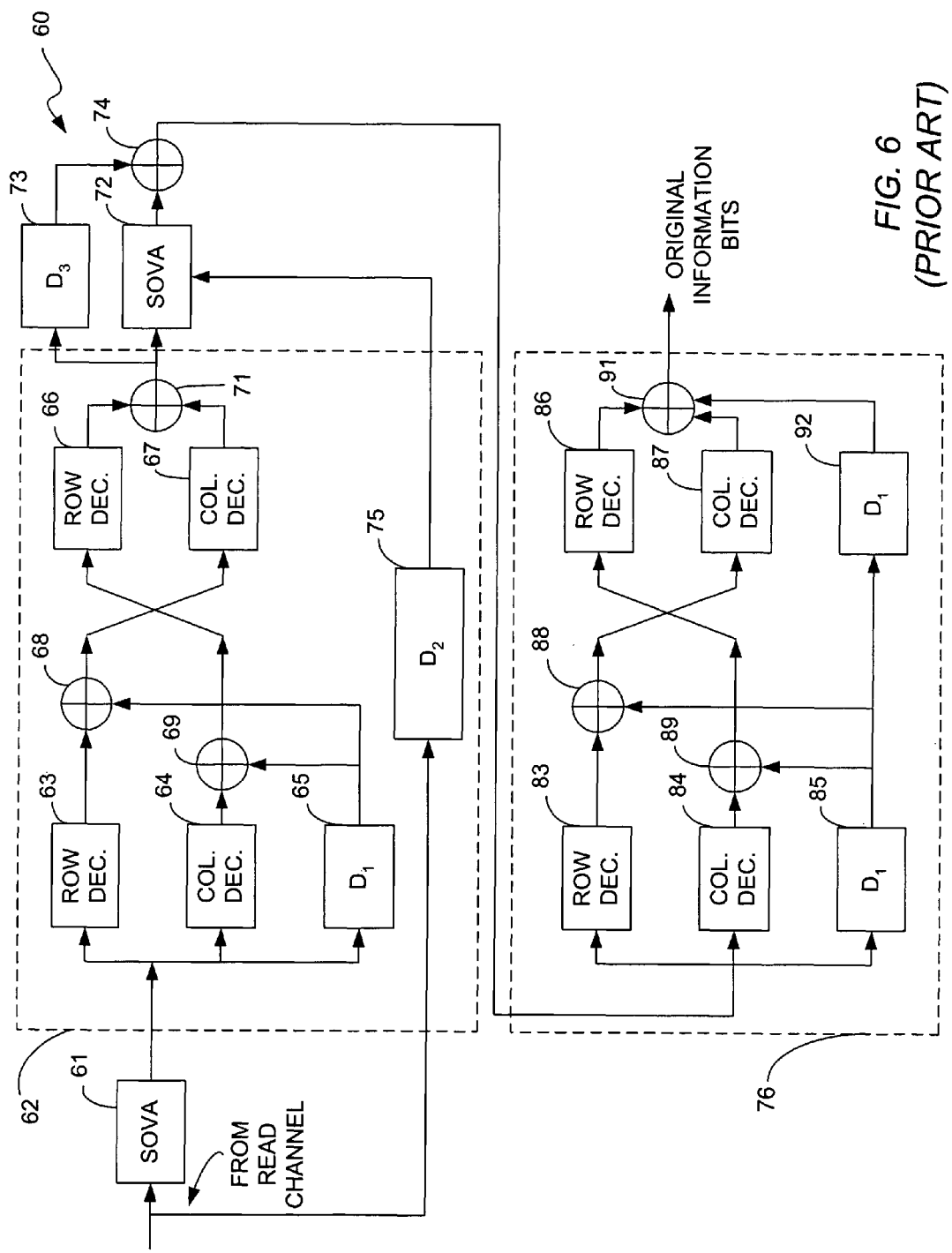
FIG. 6 illustrates a block diagram of known channel detector and decoder logic that are redundantly implemented in order to provide iteration and thereby improve detection and decoding accuracy.

In accordance with the invention, it has been determined that column decoders such as those used in the hardware configuration shown in FIG. 6 are not needed in the channel decoder when it is used in combination with a soft-output channel detector, such as a SOVA detector, that uses parity to make bit decisions. With the known channel decoder described above with reference to FIG. 6, multiple row and column decoders are needed in order to process bits iteratively. This is because the column decoders use information generated by the row decoders, and vice versa. The invention provides improved performance over the known systems even without using such iteration. Therefore, the need for column decoders and for more than one row decoder has been eliminated. Consequently, the need for multiple memory elements has also been eliminated.

In accordance with the preferred embodiment, the system of the invention includes a SOVA channel detector that uses single parity (SOVASP) to improve the accuracy with which the detector estimates bits. Each column or row read back from the read channel constitutes a code word and each code word is encoded to satisfy single parity. Because the SOVASP channel detector detects whether each code word satisfies single parity, it is unnecessary to use both a column decoder and a row decoder in the channel decoder. Either the row decoder or the column decoder can be eliminated depending on whether bits are read back on a column-by-column basis or on a row-by-row basis. This reduction in components reduces hardware complexity and improves system performance.

In accordance with an exemplary embodiment, the bit sequences are read back from the read channel on a column-by-column basis. Each column read back from the read channel constitutes a code word and each code word is encoded to satisfy single parity. Because each code word satisfies single parity and corresponds to a column in memory, using column decoders in the channel decoder would be redundant. The use of a column decoder in the channel decoder would only serve to enforce decisions made by the channel detector. Thus, it has been determined that column decoders can be eliminated from the channel decoder.

Figure 7:
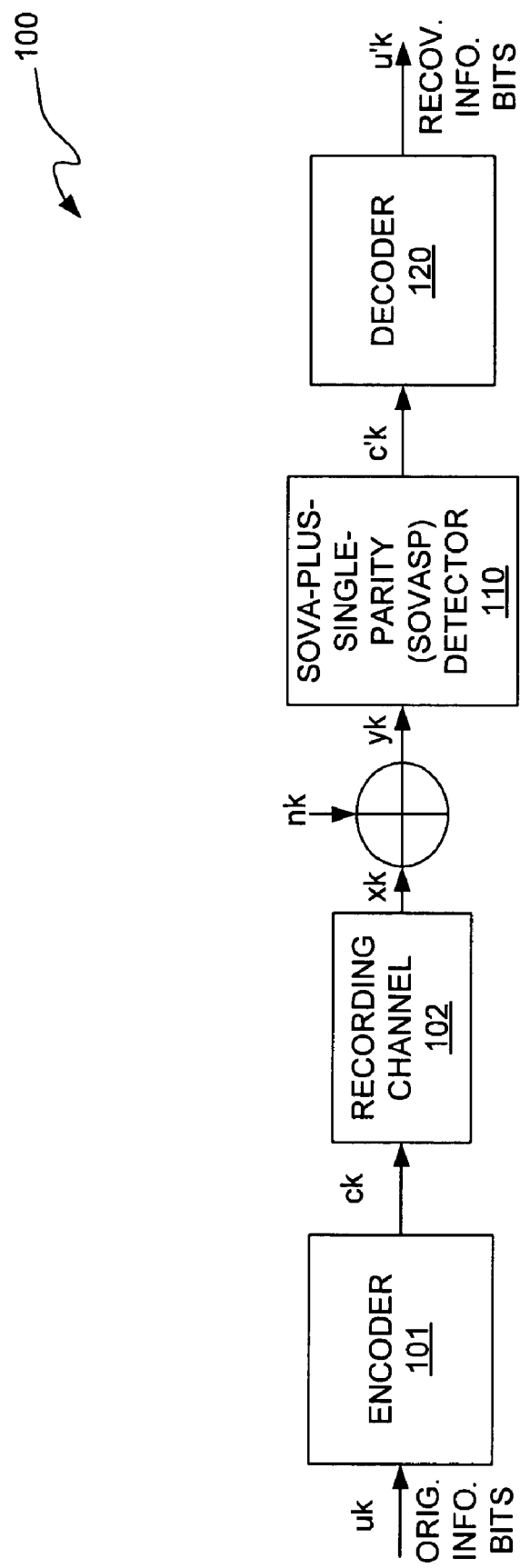
FIG. 7 illustrates a block diagram of the digital recording system of the invention in accordance with the preferred embodiment, which includes a SOVA plus single parity (SOVASP) channel detector and a decoder that has reduced hardware complexity.

FIG. 7 illustrates a block diagram of the digital recording system 100 of the present invention in accordance with an exemplary embodiment. It should be noted that the invention is not limited to digital recording systems, but is also applicable to communications system in which parity bits are used to encode data to be transmitted. In accordance with this exemplary embodiment, a TPC encoder 101 is used to encode the original information bits with single parity. For purposes of providing an example of the manner in which the digital recording system 100 operates, it will be assumed that even parity is used, that each TPC code word is 4 bits in length, and that the bits are read out of the recording channel on a column-by-column basis. Each column read out corresponds to a code word for which single parity should be satisfied.

The 4×3 table 12 shown in FIG. 2B will be used in this example to represent TPC encoded data, as each 4-bit column in the table 12 has even parity, which satisfies single parity. However, this is merely for ease of discussion. Regardless of the manner in which the parity bits are added, the encoding ensures that the parity bits are added in such a way that when the bit sequences are read back from the read channel, each code word bit sequence will satisfy the required parity. For example, if data is read out of the read channel on a row-by-row basis, each column would be encoded to satisfy single parity.

Figure 1:
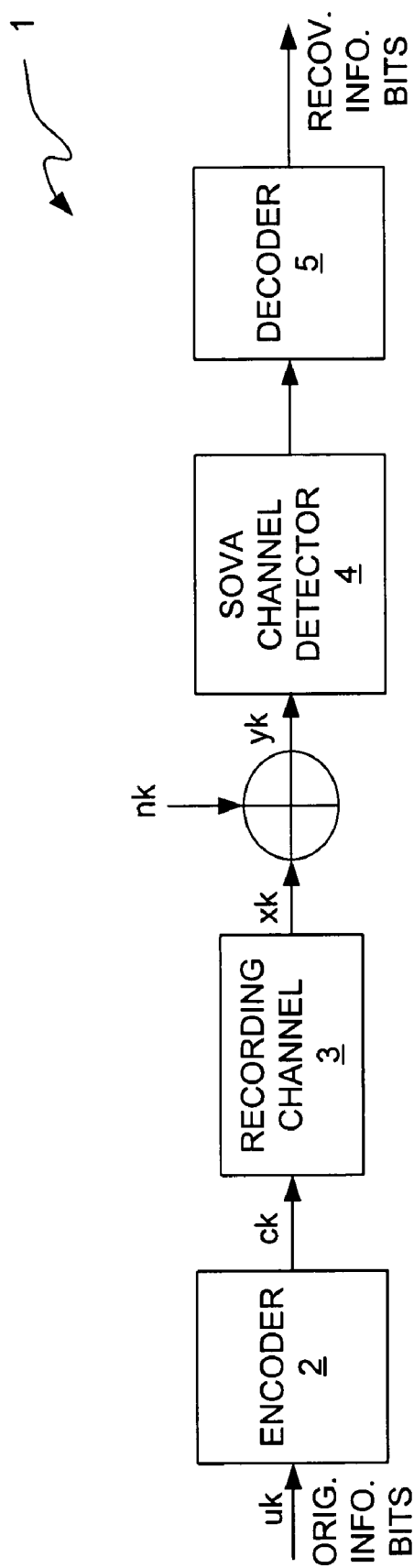
FIG. 1 illustrates a block diagram of a known digital recording system that includes a known SOVA channel detector.

The recording channel 102 shown in FIG. 7 may be identical to the recording channel 3 shown in FIG. 1. The decoder 120 shown in FIG. 7 will be described below with reference to FIG. 10. An example of the data detection algorithm performed by the SOVASP detector 110 of the invention will now be provided with reference to FIGS. 8 and 9. In addition, the 1-D channel model 20 described above with reference to FIG. 3 and the values shown in Table 1 will also be used in this example.

Figure 4:
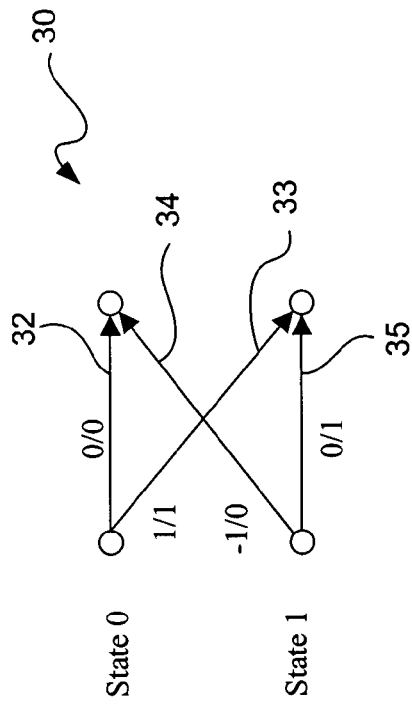
FIG. 4 illustrates a state trellis diagram for the 1-D recording channel model shown in FIG. 3.
Figure 8:
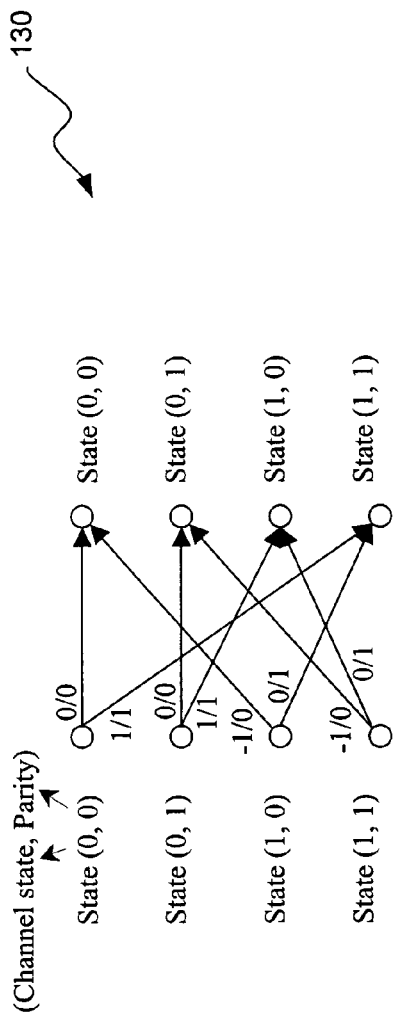
FIG. 8 illustrates a state trellis diagram for the SOVASP detector shown in FIG. 7.

FIG. 8 illustrates a state trellis diagram 130 for the 1-D channel 20 shown in FIG. 3 when single parity is used in accordance with the invention. The first bit in the parenthetical is the channel state and the second bit in the parenthetical is the parity bit. When the parity bit is used, four states exist instead of the two states shown in FIG. 4. These four states will be referred to herein as states S0, S1, S2 and S3.

Figure 5:
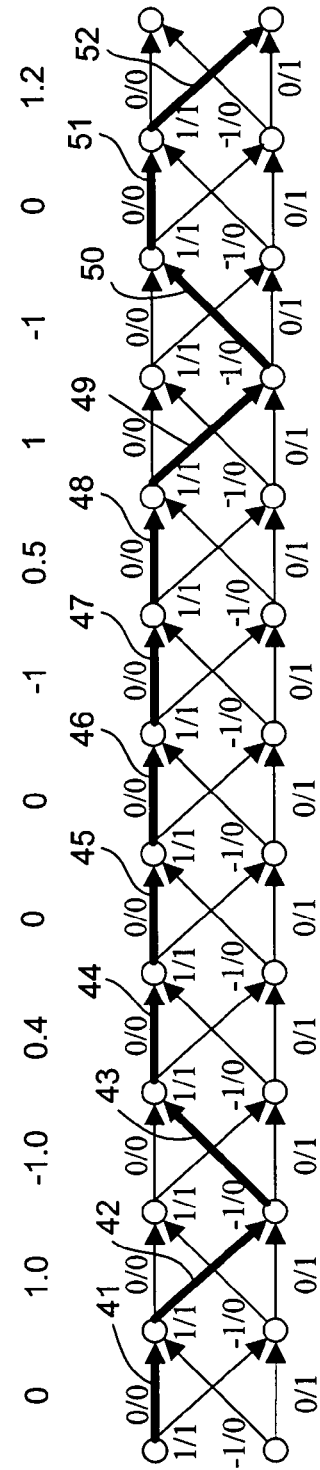
FIG. 5 illustrates a Viterbi trellis diagram for the 1-D recording channel model shown in FIG. 3.
Figure 9:
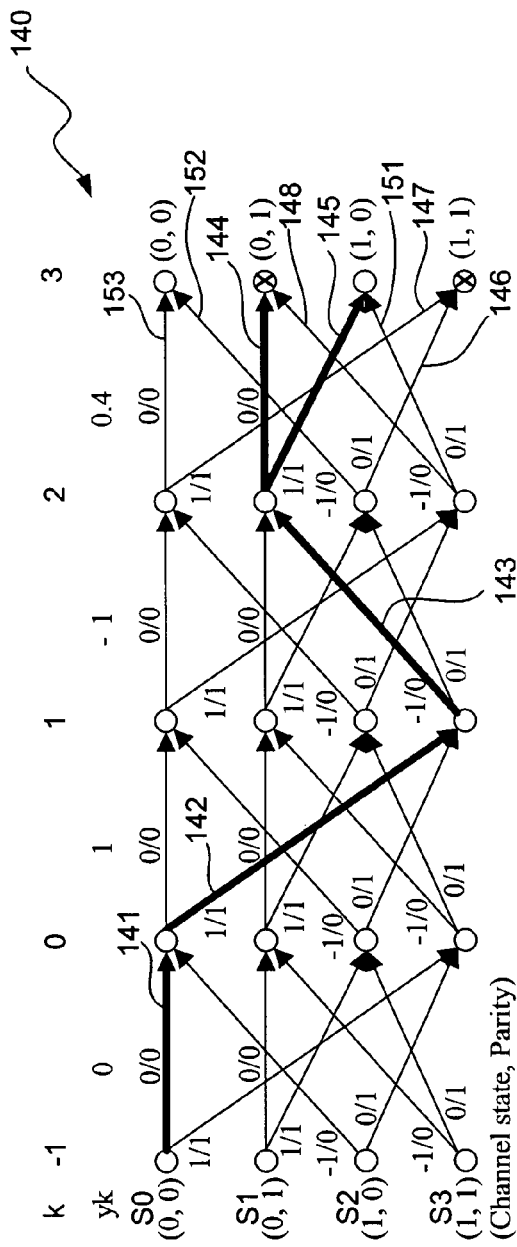
FIG. 9 illustrates a Viterbi trellis diagram for the SOVASP channel detector shown in FIG. 7.

FIG. 9 illustrates a Viterbi trellis diagram 140 for the SOVA detector 110 of the invention, which is based on the state trellis diagram 130 shown in FIG. 8. The Viterbi trellis diagram 140 shown in FIG. 9 covers one single parity codeword, which is 4 bits in length in this example. The k and yk values from Table 1 are shown listed across the top of the Viterbi trellis diagram 140 for times k=−1 through k=3. The ML path, which corresponds to branches 141-144 of the Viterbi trellis diagram 140, which are bolded in FIG. 9, is determined in the same manner described above with reference to FIG. 5.

If parity were not used to prune the trellis 140, as is the case with the known SOVA channel detector described above with reference to FIG. 1, the branch 144 would be chosen as the surviving branch at the single parity (SP) code word boundary (i.e., at the end of the 4-bit codeword boundary). This is because yk=0.4 is closer to the ideal input of 0 than it is to the ideal input of 1. This choice would result in a decision that the original input bit at time k=3 is 0. As can be seen from Table 1, this decision would be incorrect because the original input bit at time k=3 is 1.

In accordance with the invention, single parity is used to determine that the surviving branch after branch 143 is not branch 144, but is branch 145. As shown in the trellis diagram 140, the accumulated parity at time k=3 for state S1 is P=1, which violates even parity. Therefore, branch 145 is chosen instead of branch 144. Any branch leading to state S1 at time k=3 is then pruned. Likewise, the accumulated parity at time k=3 for state S3 is P=1, which violates even parity. Therefore, any branch leading to state S3 at time k=3 is also pruned. The result is that, at the SP code word boundary, which is at the end of each 4-bit code word in this example, half of the branches are pruned. For example, in this case, branches 144, 146, 147 and 148 are pruned. The surviving branches are branches 145, 151, 152 and 153.

Therefore, the channel detector of the invention makes bit decisions with much greater accuracy than known channel detectors. In addition, the channel detector 110 of the invention provides improved performance in that it enables the trellis to be pruned more quickly than with known channel detectors.

It can be seen from the foregoing that the channel detector 110 estimates whether a bit is a 1 or a 0 by using the SOVA algorithm and then uses one or more parity bits to make a decision as to whether the bit estimate was correct. The SOVASP channel detector 110 generates reliability estimates at each time for each state based on the difference between the surviving branch and the pruned branch. The channel detector 110 will typically be implemented in an IC that is configured to execute the SOVASP algorithm of the invention. Thus, the channel detector 110 can be viewed as having estimation logic configured to estimate whether a bit is a 1 or a 0, decision logic configured to use one or more parity bits to decide whether the estimation is correct, and reliability estimation logic configured to produce respective reliability estimates for the respective bit decisions.

It should be noted that the SP code words will typically be much longer than 4 bits in length. A 4-bit SP code word is used in the example provided above to simplify the description of the invention and for ease of illustration. Also, the example given above assumes that bit sequences are read from the read channel on a column-by-column basis. It should also be noted that the example given above applies equally to cases in which the bit sequences are read from the read channel row by row, diagonally, or in any other manner, provided that each code word bit sequence read back from the read channel and received in the SOVASP channel detector 110 has the required parity (i.e., even or odd).

The reliability estimates are calculated in the normal manner in which a known SOVA detector makes such calculations, which is well known in the art. Therefore, the reliability estimate calculations will not be described here in detail. As indicated above, generally the reliability estimates are calculated by obtaining the difference between each surviving branch and the corresponding pruned branch. The hard bit decisions and the reliability estimates are then used by the decoder 120 to recover the original information bits.

Figure 10:
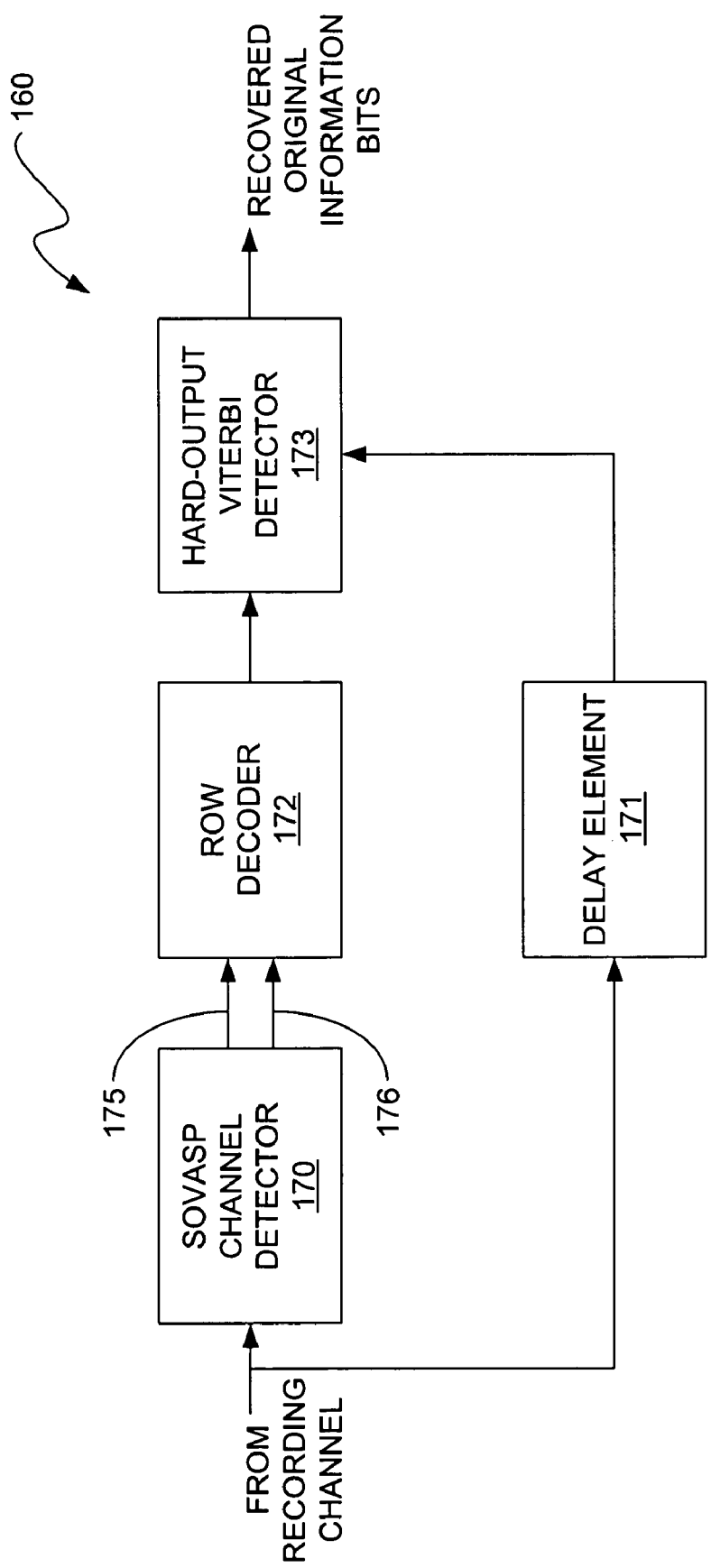
FIG. 10 illustrates a block diagram of the SOVASP channel detector of the invention in combination with the decoder of the invention in accordance with the preferred embodiment.

FIG. 10 illustrates a block diagram of the combined channel detector and channel decoder hardware of the invention in accordance with the preferred embodiment. The combination 160 includes a SOVASP channel detector 170, a delay element 171, a row decoder 172, and a hard-output Viterbi detector 173. The SOVASP channel detector 170 operates in the manner described above with reference to FIGS. 7-9. The soft and hard outputs generated by the SOVASP channel detector 170 are received by the row decoder 172. The soft and hard outputs are represented by arrows 175 and 176, respectively. No column decoder is needed due to the use of single parity in the detector 170 with each code word. In other words, because the SOVASP channel detector 170 guarantees that each column has single parity, use of a column decoder in the channel decoder would be redundant and thus is not necessary.

The row decoder 172 may be a known row decoder, such as the row decoder 63 shown in FIG. 6, for example. Those skilled in the art understand the manner in which such decoders operate and are configured. The row decoder 172 processes the soft and hard outputs received from the SOVA channel detector 170 and generates hard bit decisions that are output to the hard-output Viterbi detector 173. The hard-output Viterbi detector 173 processes the received bits in a known manner similar to that described above with reference to FIGS. 1-5 and generates hard bit decisions which correspond to the recovered original information bits. The delay element 171 causes the information being received by the SOVASP channel detector 170 to be delayed so that it arrives at the hard-output Viterbi detector 173 at the same time that the output from the row decoder 172 arrives at the hard-output Viterbi detector 173.

The reduced complexity of the hardware represented by the block diagram shown in FIG. 10 compared to the hardware represented by the block diagram shown in FIG. 6 can be clearly seen by comparing these figures. The reduction in complexity translates into greater speed, less power consumption and less area on the IC. Even with the reduction in hardware complexity, the configuration 160 shown in FIG. 10 has improved performance, i.e., accuracy, over the configuration 60 shown in FIG. 6. This is true even though the configuration 160 does not use iteration. Performance can be even further improved by cascading the configuration 160 with an identical configuration in order to implement iteration.

As stated above, the examples described herein assume that bit sequences are read back from the read channel on a column-by-column basis and that each column constitutes a code word encoded to satisfy single parity. Alternatively, each row could constitute a code word and be encoded to satisfy single parity, in which case the bit sequences would be read back from the read channel on a row-by-row basis. In this case, only a single column decoder would be needed and no row decoder would be needed. This could be accomplished by substituting a column decoder for the row decoder 172 shown in FIG. 10. The SOVASP channel detector would operate in the same manner as described above with reference to FIGS. 7-9.

Figure 11:
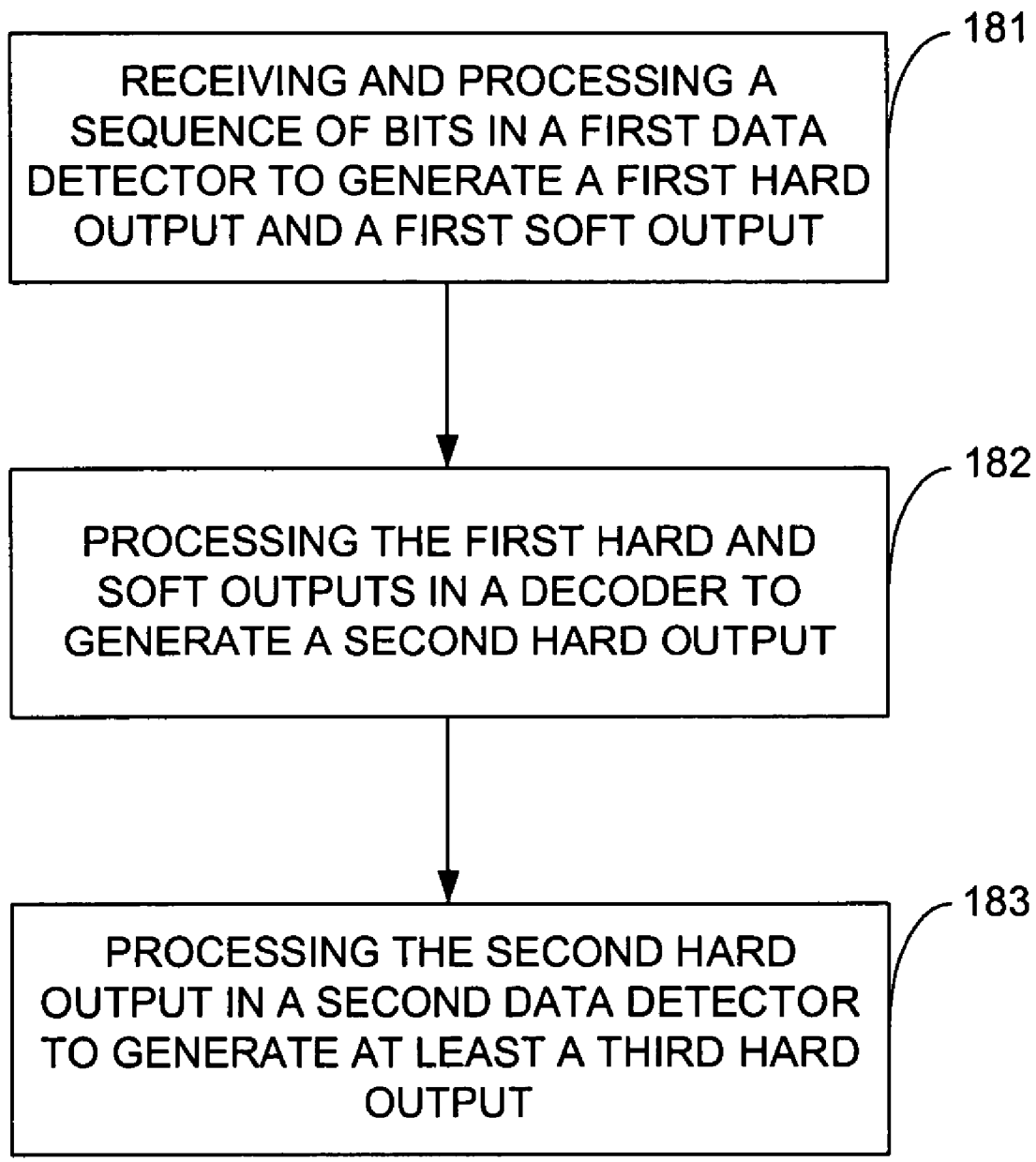
FIG. 11 illustrates a flow chart corresponding to the method of the invention in accordance with the preferred embodiment for detecting and decoding data.

FIG. 11 illustrates a flow chart demonstrating the method of the invention in accordance with the preferred embodiment. The bit sequence read back from the read channel is processed to generate a first hard output and a first soft output, as indicated by block 181. The first hard and soft outputs are then processed in a decoder to generate a second hard output, as indicated by block 182. The second hard output is then processed in a second detector to generate at least a third hard output, as indicated by block 183.

It should be noted that the invention has been described with reference to particular exemplary and preferred embodiments and that the invention is not limited to the embodiments described herein. For example, FIG. 10 illustrates a particular configuration for the invention that provides the features and advantages of the invention. However, as will be understood by those skilled in the art, different configurations or modifications to the configuration shown in FIG. 10 can be used to achieve the goals of the invention. For example, instead of the detector 173 being a hard-output Viterbi detector, the detector 173 could be a detector that produces both a hard output and a soft output, such as a SOVA detector. Those skilled in the art will understand, in view of the description provided herein, the manner in which modifications may be made to the embodiments described herein without deviating from the scope of the invention.

What is claimed is:

1. A system for detecting and decoding digital information comprising:
   a first detector that receives a bit sequence and processes the bit sequence to generate a first hard output and a first soft output, wherein the first detector is a soft-output Viterbi algorithm (SOVA) detector that uses single parity (SOVASP) to generate the first hard and soft outputs;
   a single decoding operation channel decoder that performs either a row or column decoding operation, the single decoding operation channel decoder receiving the first hard and soft outputs generated by the channel detector, the single decoding operation channel decoder processing the first hard and soft outputs in a non-iterative manner to generate a second hard output; and
   a second detector that receives the second hard output and processes the second hard output to generate at least a third hard output.

2. The system of claim 1, wherein the first detector uses one or more parity bits to generate the hard and soft outputs generated by the first detector.

3. The system of claim 1, wherein the decoder is a row decoder.

4. The system of claim 3, wherein the bit sequence received by the first detector corresponds to bits read from a recording channel on a column-by-column basis, each column corresponding to a code word that has been encoded to satisfy single parity.

5. The system of claim 1, wherein the decoder is a column decoder.

6. The system of claim 5, wherein the bit sequence received by the first detector corresponds to bits read from a recording channel on a row-by-row basis, each row corresponding to a code word that has been encoded to satisfy single parity.

7. The system of claim 1, wherein the second detector is a hard-output Viterbi detector.

8. The system of claim 1, wherein the system is part of a receiver of a communications system, the bit sequence received by the first detector corresponding to bits that have been encoded and transmitted over the communications system.

9. The system of claim 1, wherein the system is part of a digital recording system, the bit sequence received by the first detector corresponding to bits that have been encoded and stored on a memory device of the digital recording system.

10. A method for detecting and decoding digital information comprising:
    receiving and processing a bit sequence in a first detector to generate a first hard output and a first soft output, wherein the first hard and soft outputs are generated by processing the received sequence of bits in accordance with a soft-output Viterbi algorithm (SOVA) that uses single parity (SOVASP) to generate the first hard and soft outputs;
    processing the first hard and first soft outputs in a single decoding operation channel decoder that performs either a row or column decoding operation in a non-iterative manner to generate a second hard output; and
    processing the second hard output in a second detector to generate at least a third hard output.

11. The method of claim 10, wherein the first hard and soft outputs are generated using one or more parity bits that are contained in the received sequence of bits.

12. The method of claim 10, wherein the second hard output is generated by processing the first hard output and first soft output in a row decoder.

13. The method of claim 12, wherein the bit sequence received and processed to generate the first hard and first soft outputs corresponds to bits read from a recording channel on a column-by-column basis, each column corresponding to a code word that has been encoded to satisfy single parity.

14. The method of claim 10, wherein the second hard output is generated by processing the first hard output and first soft output in a column decoder.

15. The method of claim 14, wherein the bit sequence received by the bit sequence corresponds to bits read from a recording channel on a row-by-row basis, each row corresponding to a code word that has been encoded to satisfy single parity.

16. The method of claim 10, wherein the second detector is a hard-output Viterbi detector.

17. The method of claim 10, wherein the bit sequence that is processed to generate the first hard and soft outputs corresponds to bits that have been encoded and transmitted over a communications network.

18. The method of claim 10, wherein the bit sequence that is processed to generate the hard and soft outputs corresponds to bits that have been encoded and stored on a memory device of a digital recording system.

* * * * *